United States Patent
Rivoir et al.

(10) Patent No.: US 9,164,726 B2
(45) Date of Patent: Oct. 20, 2015

(54) APPARATUS FOR DETERMINING A NUMBER OF SUCCESSIVE EQUAL BITS PRECEDING AN EDGE WITHIN A BIT STREAM AND APPARATUS FOR RECONSTRUCTING A REPETITIVE BIT SEQUENCE

(75) Inventors: Jochen Rivoir, Magstadt (DE); Markus Seuring, Stuttgart (DE)

(73) Assignee: ADVANTEST CORPORATION, Tokyo (JP)

( * ) Notice: Subject to any disclaimer, the term of this patent is extended or adjusted under 35 U.S.C. 154(b) by 413 days.

(21) Appl. No.: 13/697,333

(22) PCT Filed: May 10, 2010

(86) PCT No.: PCT/EP2010/056379
§ 371 (c)(1),
(2), (4) Date: Feb. 11, 2013

(87) PCT Pub. No.: WO2011/141049
PCT Pub. Date: Nov. 17, 2011

(65) Prior Publication Data
US 2013/0198252 A1    Aug. 1, 2013

(51) Int. Cl.
*G06F 7/38* (2006.01)
*G06F 7/00* (2006.01)
*G01R 31/317* (2006.01)

(52) U.S. Cl.
CPC ............ *G06F 7/00* (2013.01); *G01R 31/31709* (2013.01); *G06F 7/38* (2013.01)

(58) Field of Classification Search
CPC .............. G06F 7/68; G06F 7/62; H03M 1/00; H03M 2201/4212; H03M 2201/4233
USPC ......................................................... 708/101
See application file for complete search history.

(56) References Cited

U.S. PATENT DOCUMENTS

| | | | | |
|---|---|---|---|---|
| 3,678,503 A | * | 7/1972 | Sollman ........................... | 341/72 |
| 4,568,881 A | * | 2/1986 | Kostrov ........................... | 327/12 |
| 4,598,283 A | * | 7/1986 | Tung et al. ...................... | 345/667 |
| 7,248,982 B1 | | 7/2007 | Drawing et al. | |
| 2006/0047450 A1 | | 3/2006 | Tabatabaei et al. | |
| 2009/0281751 A1 | | 11/2009 | Ishida et al. | |

FOREIGN PATENT DOCUMENTS

WO     2007059411     5/2007

* cited by examiner

Primary Examiner — Tan V. Mai

(57) ABSTRACT

An apparatus for determining a number of successive equal bits preceding an edge within a bit stream including a repetitive bit sequence includes an edge number determiner, an edge selector, a time stamper and an equal bits determiner. The edge number determiner determines a preset number of edges. The preset number of edges is coprime to a number of edges of the repetitive bit sequence or coprime to a maximal number of edges of the repetitive bit sequence. The edge selector selects edges of the bit stream spaced apart from each other by the preset number of edges. Further, the time stamper determines a time stamp for each selected edge of the bit stream and the equal bits determiner determines the number of successive equal bits preceding the edge based on determined time stamps of selected edges.

24 Claims, 8 Drawing Sheets

APPARATUS FOR DETERMINING A NUMBER OF SUCCESSIVE EQUAL BITS PRECEDING AN EDGE WITHIN A BIT STREAM AND APPARATUS FOR RECONSTRUCTING A REPETITIVE BIT SEQUENCE

CROSS-REFERENCE TO RELATED APPLICATIONS

This application is a Continuation of and claims priority to International Application No. PCT/EP2010/056379, filed on May 10, 2010, titled "APPARATUS FOR DETERMINING A NUMBER OF SUCCESSIVE EQUAL BITS PRECEDING AN EDGE WITHIN A BIT STREAM AND APPARATUS FOR RECONSTRUCTING A REPETITIVE BIT SEQUENCE," by Jochen Rivoir, which is herein incorporated by reference Embodiments according to the invention relate to an apparatus for determining a number of successive equal bits preceding an edge within a bit stream, an apparatus for reconstructing a repetitive bit sequence, an edge selector, a method for determining a number of successive equal bits and a method for reconstructing a repetitive bit sequence.

BACKGROUND OF THE INVENTION

Data dependent jitter (DDJ) is, for example, an important performance characteristic of high speed digital interfaces that quantifies to what degree a transition time depends on the history of bits before that transition. A transition of a digital signal, also called edge of a digital signal, means a change of the value of a digital signal from logical 1 to logical 0 or vice versa. So, data dependent jitter (DDJ) measures the dependency of transition times on the history of preceding bits and, therefore, inherently presupposes the knowledge of the immediate bit history before a measured transition. Because time measurements are usually not faster than 100 Msa/s (mega sample per second) and relevant high speed interfaces run at 2.5 Gb/s (gigabit per second) and above, it is generally impossible to timestamp all transitions. As a consequence, time stamping alone does not provide the useful information about the bit history.

In some applications, the bit stream outputted by a device under test (DUT) is not known by the test system. This unknown bit stream often comprises a repetitive bit sequence. From this bit sequence only the number of bits of the bit sequence and/or the number of edges or transitions within the bit sequence is known. From this information, the number of equal bits, also called run length, before each transition may be determined for data depending jitter analysis.

For example, there are known methods that can be applied to PRBS (pseudo random bit sequence) with known generating polynomial and unknown bit alignment. These methods do not apply to unknown bit sequences.

Jitter analysis based on time interval measurements provides the run length implicitly but makes spectral jitter decomposition very difficult. Q-space tail-fitting algorithms may be used.

Two time-stampers instead of one that time-stamp two subsequent transitions provide the run-length information as the difference between the two time-stamps. However, this involves double the amount of hardware and also doubles the memory bandwidth requirements to store time-stamp results.

Additional hardware to count the bits before each transition would increase memory bandwidth requirements to store time-stamps.

In another context, namely mixed-signal test, coherent under-sampling gathers complete information about a repetitive analog waveform by taking uniformly spaced samples at an integer fraction of the intended sample rate.

SUMMARY

According to an embodiment, an apparatus for determining a number of successive equal bits preceding an edge within a bit stream including a repetitive bit sequence may have: an edge number determiner configured to determine a preset number of edges, wherein the preset number of edges is coprime to a number of edges of the repetitive bit sequence or coprime to a maximal number of edges of the repetitive bit sequence; an edge selector configured to select edges of the bit stream spaced apart from each other by the preset number of edges; a time stamper configured to determine a time stamp for each selected edge of the bit stream; and an equal bits determiner configured to determine the number of successive equal bits preceding an edge based on determined time stamps of selected edges.

According to another embodiment, an apparatus for reconstructing a repetitive bit sequence contained by a bit stream may have: an edge number determiner configured to determine a present number of edges, wherein the preset number of edges is coprime to a number of edges of the repetitive bit sequence or coprime to a maximal number of edges of the repetitive bit sequence; an edge selector configured to select edges of the bit stream spaced apart from each other by the preset number of edges; a time stamper configured to determine a time stamp for each selected edge of the bit stream; and a reconstruction unit configured to reconstruct the repetitive bit sequence based on determined time stamps of selected edges.

According to another embodiment, an edge selector may have: a divider configured to select edges of a bit stream spaced apart from each other by a preset number of edges, wherein the preset number of edges is an odd number; and an inverter configured to provide alternating an inverted bit stream or a non-inverted bit stream to the divider for selecting edges of the bit stream, wherein the inverter changes between the inverted bit stream and the non-inverted bit stream each time an edge is selected by the divider.

Another embodiment may have an automatic test equipment with an apparatus for determining a number of successive equal bits preceding an edge within a bit stream including a repetitive bit sequence, which apparatus may have: an edge number determiner configured to determine a preset number of edges, wherein the preset number of edges is coprime to a number of edges of the repetitive bit sequence or coprime to a maximal number of edges of the repetitive bit sequence; an edge selector configured to select edges of the bit stream spaced apart from each other by the preset number of edges; a time stamper configured to determine a time stamp for each selected edge of the bit stream; and an equal bits determiner configured to determine the number of successive equal bits preceding an edge based on determined time stamps of selected edges.

Another embodiment may have an automatic test equipment with an apparatus for reconstructing a repetitive bit sequence contained by a bit stream, which apparatus may have: an edge number determiner configured to determine a present number of edges, wherein the preset number of edges is coprime to a number of edges of the repetitive bit sequence or coprime to a maximal number of edges of the repetitive bit sequence; an edge selector configured to select edges of the bit stream spaced apart from each other by the preset number of edges; a time stamper configured to determine a time stamp for each selected edge of the bit stream; and a reconstruction unit configured to reconstruct the repetitive bit sequence based on determined time stamps of selected edges.

Another embodiment may have an automatic test equipment with an edge selector, which edge selector may have: a divider configured to select edges of a bit stream spaced apart from each other by a preset number of edges, wherein the preset number of edges is an odd number; and an inverter configured to provide alternating an inverted bit stream or a non-inverted bit stream to the divider for selecting edges of the bit stream, wherein the inverter changes between the inverted bit stream and the non-inverted bit stream each time an edge is selected by the divider.

According to another embodiment, a method for determining a number of successive equal bits preceding an edge within a bit stream including a repetitive bit sequence may have the steps of: determining a preset number of edges, wherein the preset number of edges is coprime to a number of edges of the repetitive bit sequence or coprime to a maximal number of edges of the repetitive bit sequence; selecting edges of the bit stream spaced apart from each other by the preset number of edges; determining a time stamp for each selected edge of the bit stream; and determining the number of successive equal bits preceding the edge based on determined time stamps of selected edges.

According to another embodiment, a method for reconstructing a repetitive bit sequence contained by a bit stream may have the steps of: determining a preset number of edges, wherein in the preset number of edges is coprime to a number of edges of the repetitive bit sequence or coprime to a maximal number of edges of the repetitive bit sequence; selecting edges of the bit stream spaced apart from each other by the preset number of edges; determining a time stamp for each selected edge of the bit stream; and reconstructing the repetitive bit sequence based on determined time stamps of selected edges.

According to another embodiment, a method for selecting edges of a bit stream may have the steps of: selecting edges of a bit stream spaced apart from each other by a preset number of edges, wherein the preset number of edges is an odd number; and providing alternating an inverted bit stream or a non-inverted bit stream for selecting edges of the bit stream, wherein it is changes between the inverted bit stream and the non-inverted bit stream each time an edge is selected.

Another embodiment may have a computer program with a program code for performing the method for determining a number of successive equal bits preceding an edge within a bit stream including a repetitive bit sequence, which method may have the steps of: determining a preset number of edges, wherein the preset number of edges is coprime to a number of edges of the repetitive bit sequence or coprime to a maximal number of edges of the repetitive bit sequence; selecting edges of the bit stream spaced apart from each other by the preset number of edges; determining a time stamp for each selected edge of the bit stream; and determining the number of successive equal bits preceding the edge based on determined time stamps of selected edges, when the computer program runs on the computer or a micro controller.

Another embodiment may have a computer program with a program code for performing the method for reconstructing a repetitive bit sequence contained by a bit stream, which method may have the steps of: determining a preset number of edges, wherein in the preset number of edges is coprime to a number of edges of the repetitive bit sequence or coprime to a maximal number of edges of the repetitive bit sequence; selecting edges of the bit stream spaced apart from each other by the preset number of edges; determining a time stamp for each selected edge of the bit stream; and reconstructing the repetitive bit sequence based on determined time stamps of selected edges, when the computer program runs on the computer or a micro controller.

Another embodiment may have a computer program with a program code for performing the method for selecting edges of a bit stream, which method may have the steps of: selecting edges of a bit stream spaced apart from each other by a preset number of edges, wherein the preset number of edges is an odd number; and providing alternating an inverted bit stream or a non-inverted bit stream for selecting edges of the bit stream, wherein it is changes between the inverted bit stream and the non-inverted bit stream each time an edge is selected, when the computer program runs on the computer or a micro controller.

Embodiments according to the invention are based on the central ideal that the bit stream is non-uniformly under-sampled by time stamping edges of the bit stream with a constant offset of edges. In this way, the time between two time stamped edges depends on the bit stream and so the bit stream is non-uniformly sampled in time (as long as the bit stream is not only a continuous repetition of 010101, which represents an irrelevant bit stream for the described concept). Since the bit stream contains a repetitive bit sequence, it can be guaranteed that every edge of the repetitive bit sequence will be time stamped if the edges selected for time stamping are spaced apart from each other by a number of edges coprime to the number of edges of the repetitive bit sequence or (if the number of edges of the repetitive bit sequence is not known) coprime to a maximal number of edges of the repetitive bit sequence. In this way, the number of successive equal bits preceding an arbitrary edge within the bit stream may be determined or also the whole repetitive bit sequence can be reconstructed based on the determined time stamps of the selected edges.

In this way, the hardware that may be used and/or the process time that may be taken may be significantly reduced. For example, a second time stamper, additional hardware for counting bits before each edge or a difficult spectral jitter decomposition may not be necessary. Further, a non-uniformly under-sampling may provide faster results than a uniformly spaced sampling of the bit stream.

Some embodiments according to the invention relate to an edge selector comprising a divider and an inverter. The divider selects edges of the bit stream spaced apart from each other by a preset number of edges. The preset number of edges is an odd number. Further, the inverter provides alternating an inverted bit stream or a non-inverted bit stream to the divider for selecting edges of the bit stream. The inverter changes between the inverted bit stream and the non-inverted bit stream each time an edge is selected by the divider.

In this way, the divider may select only rising edges or only falling edges, so that the hardware complexity of the divider can be reduced.

BRIEF DESCRIPTION OF THE DRAWINGS

Embodiments according to the invention will be detailed subsequently referring to the appended drawings, in which:

FIG. 6b is a schematic illustration of a timing diagram of an edge selector shown in FIG. 6a;

DETAILED DESCRIPTION OF THE INVENTION

Figure 1:
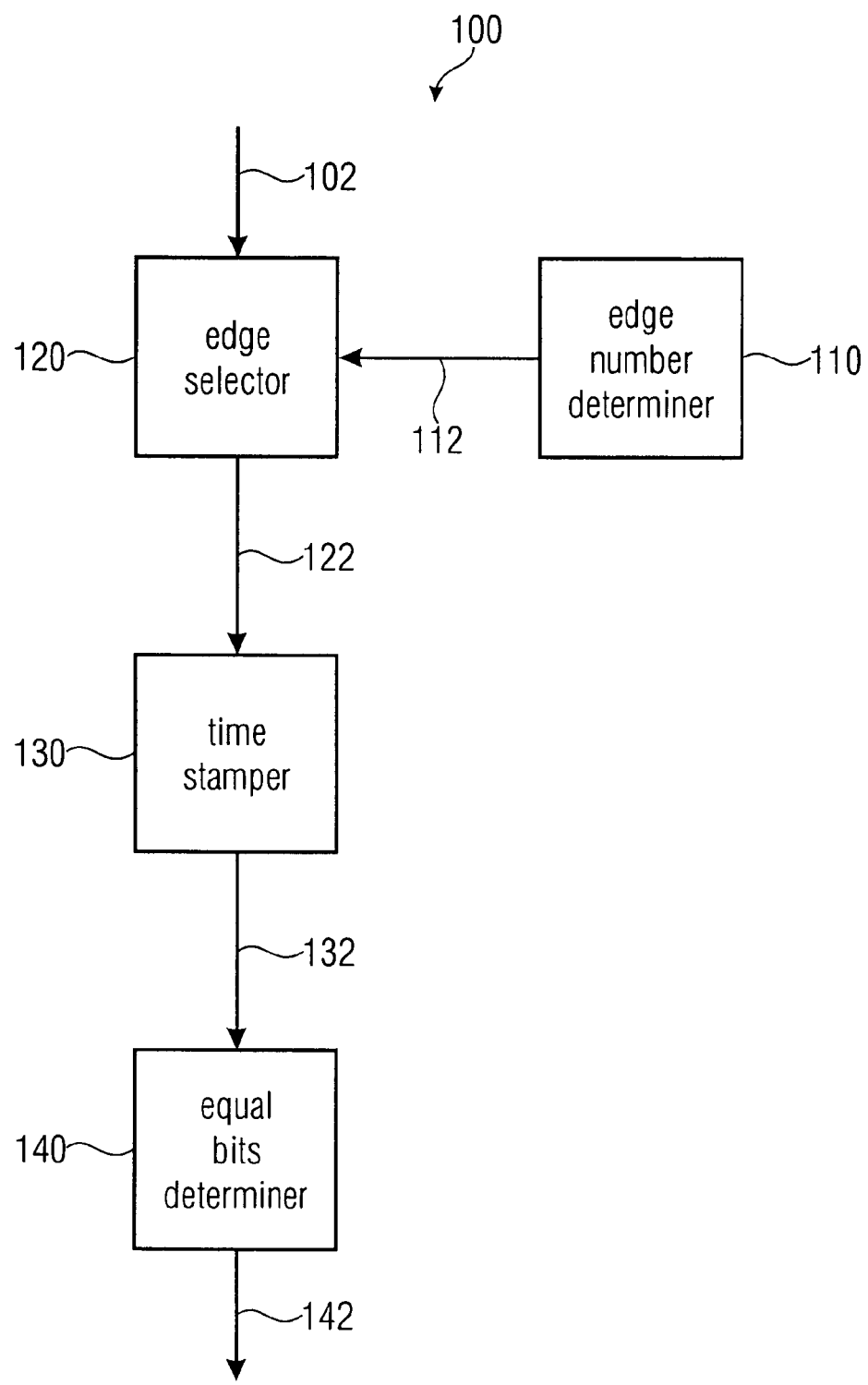
FIG. 1 is a block diagram of an apparatus for determining a number of successive equal bits preceding an edge within a bit stream.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "allocating," "associating," "moving," "copying," "setting," "accessing," "erasing," "freeing," "controlling," "adding," "recording," "determining," "identifying," "caching," "maintaining," "incrementing," "comparing," "removing," "reading," "writing," or the like, refer to actions and processes (e.g., flowcharts 700 and 800 of FIGS. 7 and 8) of a computer system or similar electronic computing device or processor. The computer system or similar electronic computing device manipulates and transforms data represented as physical (electronic) quantities within the computer system memories, registers or other such information storage, transmission or display devices.

In the following, the same reference numerals are partly used for objects and functional units having the same or similar functional properties and the description thereof with regard to a figure shall apply also to other figures in order to reduce redundancy in the description of the embodiments.

FIG. 1 shows a block diagram of an apparatus 100 for determining a number of successive equal bits 142 preceding an edge within a bit stream 102 comprising a repetitive bit sequence according to an embodiment of the invention. The apparatus 100 comprises an edge number determiner 110, an edge selector 120, a time stamper 130 and an equal bits determiner 140. The edge number determiner 110 is connected to the edge selector 120, the edge selector 120 is connected to the time stamper 130 and the time stamper 130 is connected to the equal bits determiner 140. The edge number determiner 110 determines a preset number of edges 112 so that the preset number of edges 112 is coprime to a number of edges of the repetitive bit sequence or coprime to a maximal number of edges of the repetitive bit sequence. The edge selector 120 selects edges 122 of the bit stream 102 spaced apart from each other by the preset number of edges 112. Further, the time stamper 130 determines a time stamp 132 for each selected edge 122 of the bit stream 102 and the equal bits determiner 140 determines the number of successive equal bits 142 preceding the edge based on determined time stamps 132 of selected edges 122.

The term equal bit means bits with the same value (e.g., logical 0 or logical 1, high level or low level of the signal) and a number of successive equal bits means the number of bits for which the bit stream 102 stays at a constant value.

Figure 2:
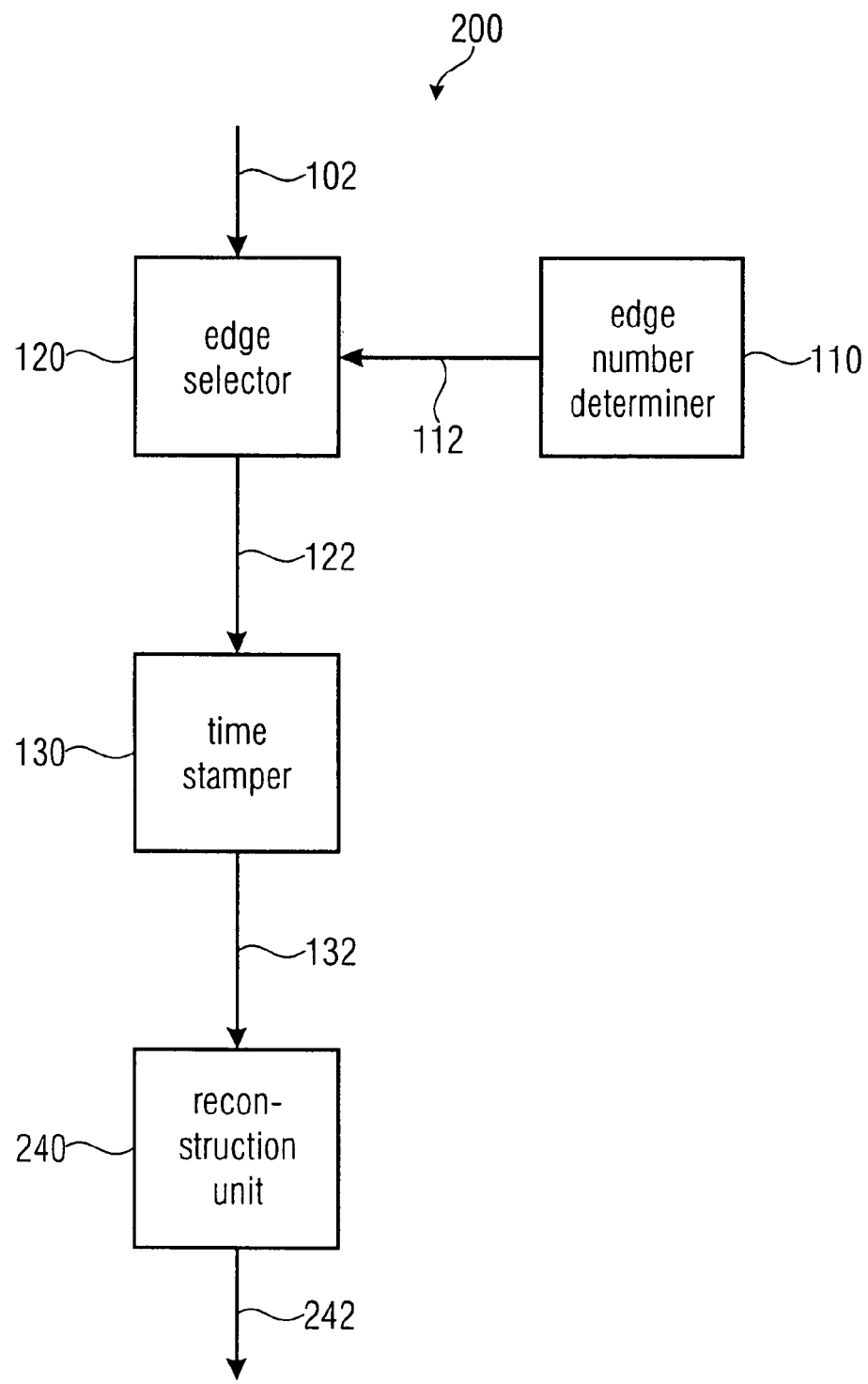
FIG. 2 is a block diagram of an apparatus for reconstructing a repetitive bit sequence.

FIG. 2 shows a block diagram of an apparatus 200 for reconstructing a repetitive bit sequence contained by a bit stream 102 according to an embodiment of the invention. The apparatus 200 comprises an edge number determiner 110, an edge selector 120, a time stamper 130 and the reconstruction unit 240. The edge number determiner 110 is connected to the edge selector 120, the edge selector 120 is connected to the time stamper 130 and the time stamper 130 is connected to the reconstruction unit 240. The edge number determiner 110 determines a preset number of edges 112, so that the preset number of edges 112 is coprime to a number of edges of the repetitive bit sequence or coprime to a maximal number of edges of the repetitive bit sequence. The edge selector 120 selects edges 122 of the bit stream 102 spaced apart from each other by the preset number 112 of edges. Further, the time stamper 130 determines a time stamp 132 for each selected edge 122 of the bit stream 102 and the reconstruction unit 240 reconstructs the repetitive bit sequence 242 based on determined time stamps 132 of selected edges 122.

The apparatus shown in FIG. 1 and the apparatus shown in FIG. 2 are based on the same basic principle, namely a non-uniformly under-sampling of a bit stream containing a repetitive bit sequence. Therefore, the following explanations of details or possible features of the edge number determiner 110, the edge selector 120, the time stamper 130 or the proposed concept in general may be equally applicable to an apparatus for determining a number of successive equal bits, as for example shown in FIG. 1, as well as for an apparatus for reconstructing a repetitive bit sequence, as for example shown in FIG. 2.

By time stamping only edges spaced apart from each other by the preset number of edges 112 (or in other words, every S-th edge, wherein S is the preset number of edges) of the bit stream 102, the sample rate can be kept significantly lower than the bit rate of the bit stream. Since the bit stream 102 is a lining up of a repetitive bit sequence, the number of successive equal bits preceding each edge or preceding an arbitrary edge within the bit stream 102 can be determined or the whole repetitive bit sequence can be reconstructed. Therefore, for example, also bit streams with very high data rates (larger than one gigabit per second) can be sampled, although the sampling frequency is significantly lower, while the hardware efforts and/or the process time may be reduced or kept low.

The edge number determiner 110, the edge selector 120, the time stamper 130 and the equal bits determiner 140 or the reconstruction unit 240 may be, for example, independent hardware units or part of a computer, micro controller or digital signal processor as well as a computer program or software product for running on a computer, micro controller or digital signal processor.

The edge number determiner 110 determines the preset number of edges 112. This preset number of edges 112 is coprime to a number of edges of the repetitive bit sequence or coprime to a maximal number of edges of the repetitive bit sequence. Since the edge selector selects edges of the bit stream spaced apart from each other by the preset number 112 of edges, it may be guaranteed by the proposed selection of the preset number of edges 112 that every edge of the repetitive bit sequence can be selected within the bit stream. Therefore, after selecting the preset number of edges 112 from several successive bit sequences, each edge of the bit sequence may be selected at least one time.

In some applications of the described concept, the number of edges of the repetitive bit sequence is predefined or known, so that the preset number of edges 112 can be chosen coprime to the predefined number of edges of the repetitive bit sequence.

In contrast to this, sometimes only the number of bits of the repetitive bit sequence is predefined or known. Then, the preset number of edges 112 may be coprime to a maximal number of edges of the repetitive bit sequence. For a bit sequence with a given number of bits (also called length of the bit sequence) the maximal number of edges of the bit sequence is equal to the number of bits of the bit sequence, if the number of bits of the bit sequence is even (representing a continuous repetition of 01), and equal to the number of bits of the bit sequence minus 1 for a bit sequence comprising an odd number of bits. Since a continuous repetition of 01 is not of interest, the maximal number of edges of the repetitive sequence may be chosen equal to the number of bits of the bit sequence minus 1 in general.

In the case of an unknown number of edges of the repetitive bit sequence, more than one (e.g. 2, 3, 4 or more) preset number of edges 112 coprime to the maximal number of edges of the repetitive bit sequence and coprime to each other may be determined. If the product of the more than one preset number of edges 112 is larger than the maximal number of edges, it may be guaranteed that each edge of the repetitive bit sequence may be selected at least one time by using the more than one preset number of edges 112. In other words, the edge number determiner 110 may determine a plurality of preset numbers of edges 112, each preset number of edges (112) being coprime to the maximal number of edges of the repetitive bit sequence and each preset number of edges 112 being coprime to each other preset number of edges 112. A product of the preset numbers of edges of the plurality of preset numbers of edges is larger than the maximal number of edges of the repetitive bit sequence. Further, the edge selector 120 may select edges 122 of the bit stream 102 for each preset number of edges 112 spaced apart from each other by the respective preset number of edges 112.

The process time (e.g. the time until a number of successive equal bits preceding an edge or a reconstructed bit sequence can be obtained) may be reduced by choosing the preset number of edges 112 being one of the smallest or the smallest number coprime to the number of edges of the repetitive bit sequence or the maximal number of edges of the repetitive bit sequence, since in this way a lower number of repetitions of the bit sequence within the bit stream 102 may be sampled until each edge of the bit sequence is sampled at least one time. However, the smallest possible number useable for the preset number of edges may be limited by a maximum sample rate of the time stamper 130. The maximum sample rate of the time stamper defines the minimum time between two edges, the time stamper 130 is able to time stamp. Therefore, for example, the edge number determiner 110 may determine the preset number of edges 112, so that the preset number is the smallest number coprime to the number of edges of the repetitive bit sequence or coprime to the maximal number of edges of the repetitive bit sequence considering the maximum sample rate of the time stamper 130.

The edge selector 120 may select edges 122 from the bit stream 102 until at least a number of edges equal to the number of edges of the repetitive bit sequence or equal to the maximal number of edges of the repetitive bit sequence is selected. In this way, it may be guaranteed that each edge of the bit sequence, although selected within different repetitions of the bit sequence, may be selected at least one time. So, a number of successive equal bits preceding each edge of the bit sequence can be determined or the whole bit sequence can be reconstructed.

In some applications of the described concept the number of bits of the bit sequence is not known, while the number of edges of the repetitive bit sequence is known. In this case, a bit sequence length determiner which may be an independent hardware unit or part of the equal bits determiner 140 or the reconstruction unit 240, may determine the number of bits of the repetitive bit sequence. For this, the edge selector 120 may select edges 122 from the bit stream 102 until at least a number of edges equal to the number of edges of the repetitive bit sequence plus 1 is selected. Then, the bit sequence determiner may determine the number of bits of the repetitive bit sequence based on time stamps 132 of two edges 122 spaced apart from each other by a number of selected edges 122 equal to the number of edges of the repetitive bit sequence plus one. In other words, the number of bits of the repetitive bit sequence may be determined based on the time difference between selecting an edge of the repetitive bit sequence and selecting the same edge within a later repetition of the repetitive bit sequence. This may also be expressed by the following equation:

$$B=(B_{E+1}-B_1)/S$$

In contrast to the apparatus shown in FIG. 1, the apparatus shown in FIG. 2 reconstructs the whole bit sequence. Certainly, the apparatus shown in FIG. 2 can also determine a number of successive equal bits preceding an edge within the bit stream based on the reconstructed bit sequence, although the hardware efforts for the apparatus shown in FIG. 1 may be lower, if a reconstruction of the whole bit sequence may not be necessary.

In some embodiments, the reconstruction unit 240 may reconstruct the repetitive bit sequence 242 based on the determined time stamps 132 of the selected edges 122 and, for example, additionally based on a direction of a selected edge 122 or a value (logical 1 or logical 0) of a bit of the repetitive bit sequence. For this, it may be sufficient to determine a direction of only one selected edge or to determine a value of only one bit of the repetitive bit sequence, since the rest of the bit sequence may be fixed by the knowledge of all edges of the bit sequence. Alternatively, the directions of more than one or all selected edges 102 may be determined, which may be an already available information, since the edge selector 120 may know whether a rising edge or a falling edge is selected. Alternatively, the apparatus 200 may comprise a direction determiner for determining a direction of a selected edge 122 or a bit value determiner for determining a value of a bit of the repetitive bit sequence.

Figure 3:
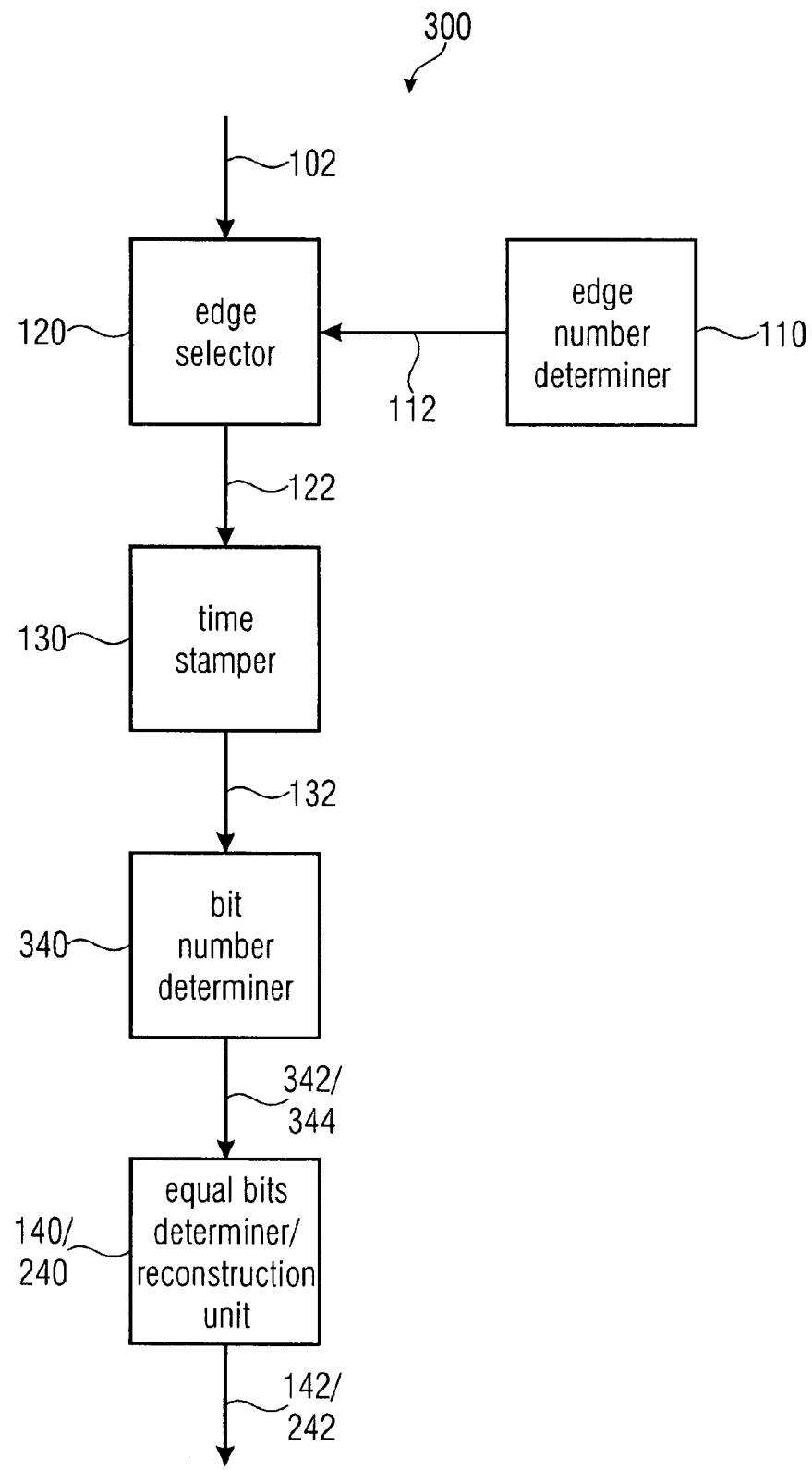
FIG. 3 is a block diagram of an apparatus for determining a number of successive equal bits or an apparatus for reconstructing a repetitive bit sequence.

Some embodiments of the invention comprise bit number determiner. The bit number determiner may be part of an equal bits determiner 140 of an apparatus for determining a number of successive equal bits as shown, for example, in FIG. 1 or part of a reconstruction unit 240 of an apparatus for reconstructing a repetitive bit sequence as shown, for example, in FIG. 2. Alternatively, the bit number determiner 340 may be an independent hardware unit connected to the equal bits determiner 140 or the reconstruction unit 240 as shown in FIG. 3.

The bit number determiner 340 may determine an absolute bit number 342 of a reference bit within the bit stream 102 based on at least one determined time step 132 of a selected edge 122. The absolute bit number 342 indicates a position of the reference bit within the bit stream. Usually the reference bit of the selected edge 122 is the directly preceding bit or the directly succeeding bit of the selected edge 122 within the bit stream 102. Alternatively, also other bits comprising a deterministically determinable distance to the selected edge 122 may be possible. In other words, a selected edge may be associated to reference bit with a determined absolute bit number 342. Such an absolute bit number 342 may be determined for a reference bit for each selected edge 122. The bit number determiner 340 may determine the absolute bit number 342 of a reference bit, for example, based on time stamps 132 of two directly successive selected edges 122. In other words, the time difference between two selected edges 122 may indicate how many bits are between the selected edges and, therefore, if the absolute number of a reference bit of one of the selected edge is known, the absolute bit number 342 of the reference bit of the other edge can be determined.

The absolute bit numbers 342 may be counted starting, for example, at 1 (or another start number) for the bit of the bit stream passing, for example, the time stamper 130 or the edge selector 120 at a reference time. The reference time may be, for example, a start time for selecting edges or a reset time of the time stamper 130.

More general, the equal bits determiner 140 may determine the number 142 of successive equal bits preceding the edge based on bit numbers of reference bits within the bit stream 102 determined based on the determined time stamps 132 of the selected edges 122. Comparably, the reconstruction unit 240 may reconstruct the repetitive bit sequence 242 based on bit numbers of reference bits within a bit stream 102 determined based on the determined time stamps 132 of the selected edges 122.

The bit number determiner 340 may determine a relative bit number 342 within the repetitive bit sequence for each reference bit, an absolute bit number 342 is determined for.

For example, the absolute bit numbers $B_n$ 342 may be determined according to the following equation, with $t_n$ indicating the time stamp of an selected edge and T indicating the bit period:

$$B_1 = \left[\frac{t_1}{T}\right]$$

$$B_n = B_{n-1} + \left[\frac{t_n - t_{n-1}}{T}\right], n = 1 \ldots N$$

$[\cdot]$ denotes rounding to the closest integer and $t_1$, for example, is the time between the reference time (e.g. start time, reset time of time stamper) and the occurrence of the first selected edge.

Inherently, this assumes less than half a unit interval of drift between consecutive timestamps.

Usually the bit period T is accurately known, for example in ATE applications, but sometimes the bit period is only known to be somewhere in the interval $T_{min} \leq T \leq T_{max}$. In this case the bit period T may be estimated based on the timestamps.

Consider the time intervals $\Delta t_n$ between subsequent timestamps, $\Delta t_n = t_n - t_{n-1}$, $n = 2 \ldots N$. This time difference is caused by an unknown number $\beta_n$ of bits of duration T and a random jitter variable $j_n$, with upper absolute limit J for all intervals, $|j_n| \leq J$.

$$\Delta t_n = \beta_n T + j_n, \text{ for } n = 2 \ldots N \quad (6)$$

Upper and lower bounds for the number of bits can be computed from formula (6), which is shown in formula (7):

$$\beta_{n,min} = \left\lceil \frac{\Delta t_n - J}{T_{max}} \right\rceil, \beta_{n,max} = \left\lfloor \frac{\Delta t_n + J}{T_{min}} \right\rfloor \quad (7)$$

$\lceil \cdot \rceil$ and $\lfloor \cdot \rfloor$ denotes rounding up, or down to the closest integer, respectively. Going back to formula (6) allows updating upper and lower bounds for the bit period:

$$T_{min} = \max\left(\frac{\Delta t_n - J}{\beta_{n,max}}, T_{min}\right), T_{max} = \min\left(\frac{\Delta t_n + J}{\beta_{n,min}}, T_{max}\right). \quad (8)$$

For example, equations (7) and (8) may be repeated for some or all intervals and iterated across the intervals until all numbers of bits $\beta_n$ are uniquely known, when the sum of bit uncertainties $$\sum_{n=2}^{N} (\beta_{n,max} - \beta_{n,min}) \quad (9)$$

is not reduced in a given iteration of the intervals, the uncertainty intervals, $T_{min} \leq T \leq T_{max}$, may be too large for the given time intervals $\Delta t_n$. It may not be possible to estimate the unit interval accurately enough to determine the exact number of bits between timestamps which, for example, is important for any unit interval tracking algorithm.

If all numbers of bits $\beta_n$ are uniquely known, for example, $\beta_{n,min} = \beta_{n,max}$, the bit period can be estimated as (with $t_0$ as reference time):

$$\hat{T} = \frac{t_n - t_0}{\sum_{n=2}^{N} \beta_n} \quad (10)$$

So, a bit period T may refer to an accurately known (for example, with a tolerance of +/−5%) or to an estimated unit interval.

In other words, considering an unknown or not exactly known bit period T, the bit number determiner 340 may determine the absolute bit number 342 of a reference bit within the bit stream 102 based on at least one determine time stamp 132 of the selected edge 122, a maximum bit period $T_{max}$, a minimum bit period $T_{min}$ and a maximum bit period variation J. The bit period indicates the temporal length of a bit of the bit stream 102.

Further, the bit number determiner 340 may determine a relative bit number 344 within the repetitive bit sequence for a reference bit based on the absolute bit number 342 of the reference bit and based on a number of bits of the repetitive bit sequence. In other words, the edges selected partly from different repetitions of the bit sequence are mapped to the edges of a single bit sequence by determining relative bit numbers 344 within this bit sequence. This may be done, for example, by using the modulo function. The relative bit numbers 344 may be equal to the absolute bit numbers 342 modulo the number of bits of the repetitive bit sequence B. This may be indicated by the following equation:

$$b_k = (B_k \bmod B)$$

With $b_k$ representing the relative bit number 344, $B_k$ representing the absolute bit number 342 and B representing the number of bits of the repetitive bit sequence.

Additionally, the bit number determiner 340 may sort the relative bit numbers 344 of reference bits associated to selected edges 122 in ascending order or descending order.

Based on the absolute bit numbers 342 or the relative bit numbers 344, the equal bits determiner 140 may determine the number of successive equal bits preceding an edge or the reconstruction unit 240 may reconstruct the repetitive bit sequence.

Using the relative bit numbers 342, the equal bits determiner 140 may determine the number of successive equal bits preceding the edge based on a relative bit number 342 of a reference bit associated to the observed edge and the relative bit number 342 of a reference bit associated to a directly preceding edge of the bit stream 102.

In other words, the difference of the relative bit numbers 344 of reference bits of edges following each other may indicate the number of successive equal bits 142 preceding the observed edge.

Alternatively, absolute bit numbers 342 and/or relative bit number 344 may be associated directly to the selected edges 122, they are determined for, instead of determining the absolute bit numbers 342 and/or the relative bit numbers 344 for reference bits. In other words, the bit number determiner 340 may determine an absolute bit number 342 within the bit stream 102 associated to a selected edge 122 based on the time stamp 132 determined for the selected edge 122. Further, the bit number determiner 340 may determine a relative bit number 344 of the selected edge 122 within the repetitive bit sequence based on the absolute bit number 342 of the selected edge 122 and based on a number of bits of the repetitive bit sequence.

Figure 4:
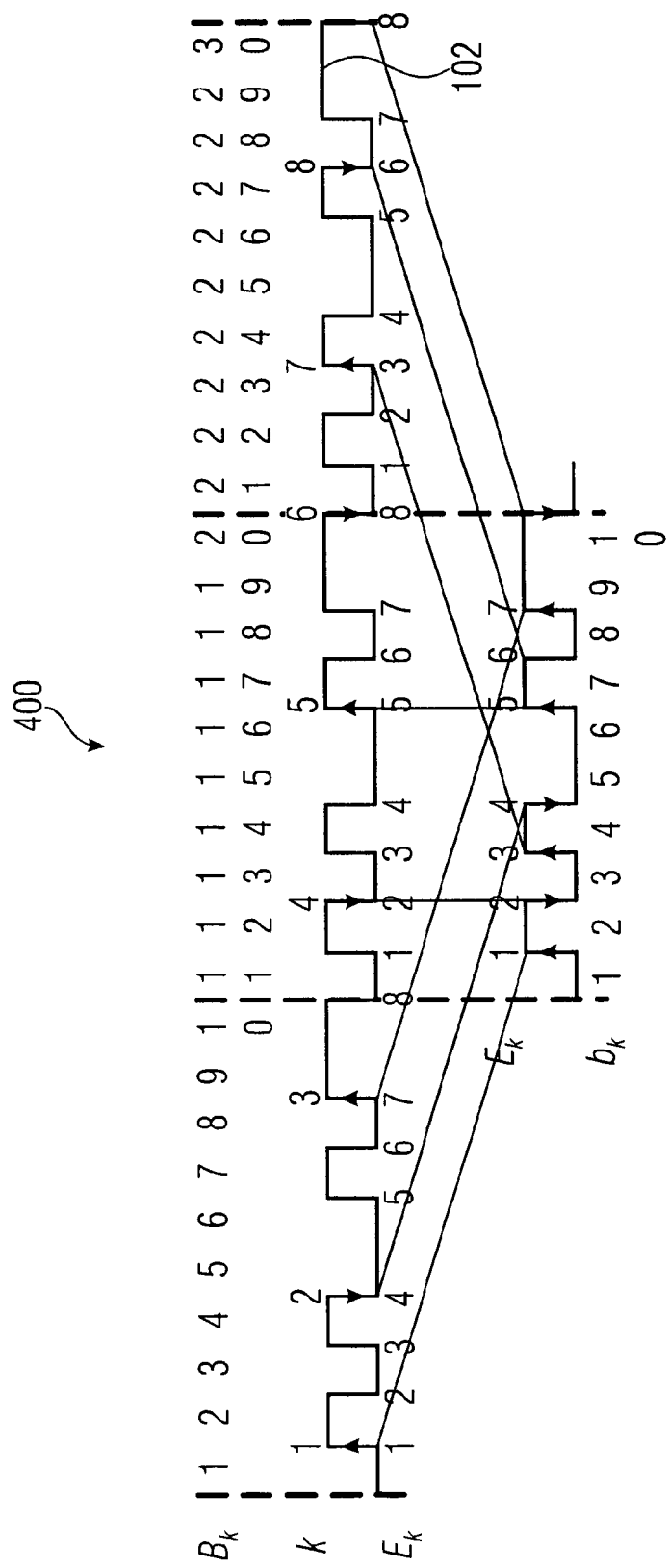
FIG. 4 is a schematic illustration of an example for determining a number of successive equal bits.

FIG. 4 shows an example 400 for determining a number of successive equal bits preceding an edge within a bit stream and/or for reconstructing a bit sequence. This is an example for a repetitive bit sequence with a number of bits B=10 and a number of edges E=8. Further, every third edge (transition) is time stamped. Therefore, in this example, the present number of edges S=3 (3 is coprime to 8). In other words, E is the number of edges of the repetitive bit sequence, B is the number of bits of the repetitive bit sequence and every S-th edge is time stamped. Further, $B_k$ indicates absolute bit numbers, k indicates a counting parameter for the selected edges, $E_k$ indicates a position of an edge within the repetitive bit sequence and may be also called relative edge number and $B_k$ indicates the relative bit numbers within the repetitive bit sequence.

An example for basic steps for determining the number of successive equal bits preceding an edge and/or reconstructing the bit sequence are:

Select S coprime to E
(determine the preset number of edges)
Measure M=E time-stamps $(t_k, d_k)$, k=1 ... M
(select edges and determine time stamps for each selected edge, wherein $t_k$ indicates a time stamp, $d_k$ indicates a direction of an edge and M indicates the number of measured or determined time stamps, wherein the direction $d_k$ of an edge may only be used for reconstructing the whole bit sequence)
Track bit numbers $B_k$
(determine absolute bit numbers)
Relative bit numbers $b_k = (B_k \bmod B)$
(determine relative bit numbers)
Sort $b_k$ in ascending order
(or descending order)
Run length $r_e = b_e -_B b_{e-1}$, for e=$E_1$ ... $E_E$, where $-_B$ denotes subtraction modulo B (subtraction modulo B means applying the modulo function to the subtrahend of the subtraction as well as to the result of the subtraction) and $b_0 = b_E$
($r_e$ indicates the number of successive equal bits preceding edge E, $b_e$ indicates the sorted relative bit number associated to edge E, and e indicates the relative edge number from $E_1$ to $E_E$), These basic steps may be extended and/or adapted to the respective boundary conditions or constraints of the application.

For example, if the number of edges E of the repetitive bit sequence and the number of bits B of the repetitive bit sequence is known or predefined, the following steps may be used:

Find the maximum sample rate of the time-stamper and express it in units of bit periods, $S_{min}$.
($S_{min}$ indicates the lowest number of bits between two edges, the time stamper is able to sample)
Select the smallest S≥$S_{min}$ that is coprime with E
(determining preset number of edges S considering the maximum sample rate of the time stamper by $S_{min}$)
Measure M=E time-stamps $(t_k, d_k)$, k=1 ... M.
Track bit numbers $B_k$.
Relative bit numbers $b_k = (B_k \bmod B)$.
Sort $b_k$ in ascending order.
Run-length $r_e = b_e -_B b_{e-1}$, for e=$E_1$ ... $E_E$, where '$-_B$' denotes subtraction modulo B and $b_0 = b_E$.

Further, if the number of edges E of the repetitive bit sequence is known or predefined, while the number of bits B of the repetitive bit sequence is unknown, for example, the following steps may be used:

Find the maximum sample rate of the time-stamper and express it in units of bit periods, $S_{min}$.
Select the smallest S≥$S_{min}$ that is coprime with E.
Measure M=E+1 time-stamps $(t_k, d_k)$, k=1 ... M.
Track bit numbers $B_k$.
Determine length of bit sequence B=$(B_{E+1} - B_1)/S$.
(number of bits of the repetitive bit sequence)
Relative bit numbers $b_k = (B_k \bmod B)$, for k=1 ... E.
Sort $b_k$ in ascending order.
Run-length $r_e = b_e -_B b_{e-1}$, for e=$E_1$ ... $E_E$, where '$-_B$' denotes subtraction modulo B and $b_0 = b_E$.

In another example, the number of bits B of the repetitive bit sequence is known or predefined, while the number of edges E of the repetitive bit sequence is unknown. In this case, for example, the following steps may be carried out:

Find the maximum sample rate of the time-stamper and express it in units of bit periods, $S_{min}$.

Maximum number of edges in a repetitive bit sequence $E_{max}=B-1$.

Select smallest plurality of S with $E_{max} > S_i \geq S_{min}$ and $S_1 \bullet \ldots \bullet S_i \bullet \ldots \bullet S_N > E_{max}$ each coprime with $E_{max}$ and coprime to each other.

Measure $M=E_{max}$ time-stamps $(t_k, d_k)$, k=1 ... M for each $S_i$.

Track bit numbers $B_k$ for each $S_i$.

Relative bit numbers $b_k = (B_k \mod B)$.

Discard redundant relative bit numbers. Discard $b_k$ where $b_k = b_j$, j=1 ... k-1.

Number of edges, E, equal the number of remaining, and thus unique, relative bit numbers $b_k$.

Sort $b_k$ in ascending order.

Run-length $r_e = b_e -_B b_{e-1}$, for $e = E_1 \ldots E_E$, where '$-_B$' denotes subtraction modulo B and $b_0 = b_E$.

In general, among others the following observations may be made in connection with the proposed concept.

When every S-th edge of a repetitive bit sequence with E edges is time-stamped, all E edges will be time-stamped after E time-stamps, if S shares no divider with E.

The number of edges E of a (repetitive) bit sequence is even. (For each rising edge there is be a falling edge before the next rising edge.)

By implication, S is odd.

A bit stream with a minimum repetition length of B>2 bits can have at most B−1 edges.

Summarizing, some of the basic ideas of the described concept are, for example:

Select and time-stamp every S-th edge of a repetitive bit-stream with E edges, where S is coprime with E.

Take at least E time-stamps, where each time-stamp consists of a time $t_k$ and (optional) a direction $d_k$. This can ensure that all edges in a repetitive bit sequence have been time-stamped at least once.

For example, a software tracking algorithm identifies absolute bit numbers for each time-stamped edge.

With known duration of the bit stream, the relative bit numbers of all edges within the bit stream are also known.

The run length before a given edge is finally given by the relative difference to the previous edge within the repetitive bit sequence in units of bit periods.

With recorded directions $d_k$, the complete bit stream can be reconstructed. All bits after a rising transition and before the next falling transition are '1', and vice versa.

Some embodiments of the invention relate to an edge selector, also called transition selector.

The transition selector is a circuit that selectively propagates every S-th edge. Because S is odd, it alternates between rising and falling transitions (edges) and may therefore invert the input signal from the DUT after every propagated signal transition (after every selected edge).

Figure 5:
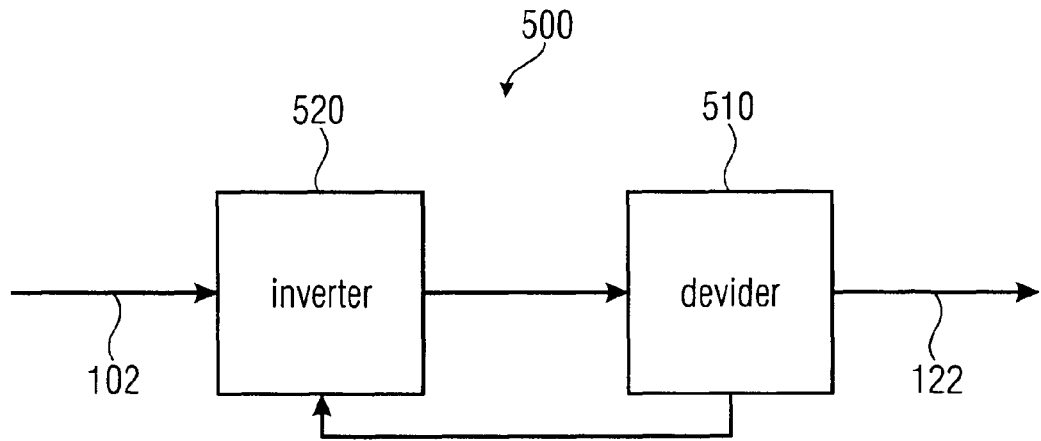
FIG. 5 is a block diagram of an edge selector.

FIG. 5 shows a block diagram of an edge selector 500 according to an embodiment of the invention. The edge selector 500 comprises a divider 510 connected to an inverter 520. The divider 510 selects edges 122 of a bit stream 102 spaced apart from each other by a preset number of edges. The preset number of edges is an odd number. Further, the inverter 520 provides alternating an inverted bit stream or a non-inverted bit stream to the divider 510 for selecting edges 122 of the bit stream 102. The inverter 520 changes between the inverted bit stream and the non-inverted bit stream each time an edge 122 is selected by the divider 510.

In this way, it is possible that the divider 510 is triggered only by rising edges or by falling edges, although the preset number of edges is odd.

The edge selector 500 shown in FIG. 5 may be implemented in an apparatus for determining a number of successive equal bits preceding an edge within a bit stream or implemented in an apparatus for reconstructing a repetitive bit sequence.

Figure 6A:
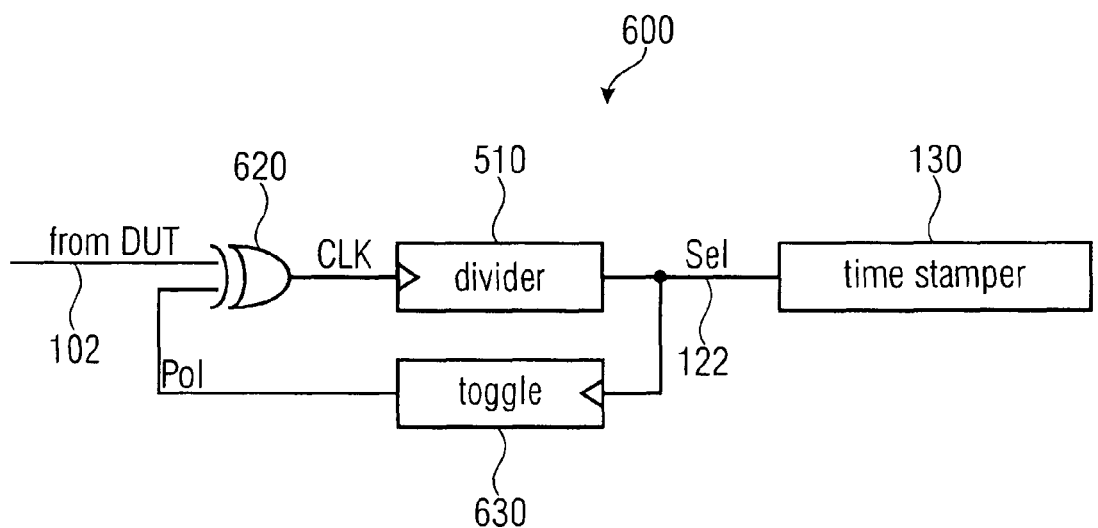
FIG. 6a is a block diagram of an edge selector.

FIG. 6a shows a block diagram of another edge selector 600 according to an embodiment of the invention. The edge selector 600 is similar to the edge selector shown in FIG. 5, but comprises additionally a toggle unit 630 and the inverter is implemented as an exclusive disjunction 620, also called XOR gate. Further, a time stamper 130 connected to the divider 510 of the edge selector 600 is shown. The divider 510 is connected to the toggle unit 630, the toggle unit 630 is connected to the XOR gate 620 and the XOR gate 620 is connected to the divider 510. The bit stream 102, for example, received from a DUT (device under test), is provided to the XOR gate 620.

The toggle unit 630 may provide a toggle signal Po1 to the inverter 620. The toggle unit 630 may change a value of the toggle signal Po1 each time an edge 122 is selected by the divider 510.

If the inverter 620 is implemented as an XOR gate as shown in FIG. 6a, the bit stream 102 may be provided to a first input of the XOR gate 620, the toggle signal Po1 may be provided to a second input of the XOR gate 620 and the inverted bit stream or the non-inverted bit stream may be provided at an output of the XOR gate 620.

Figure 6B:
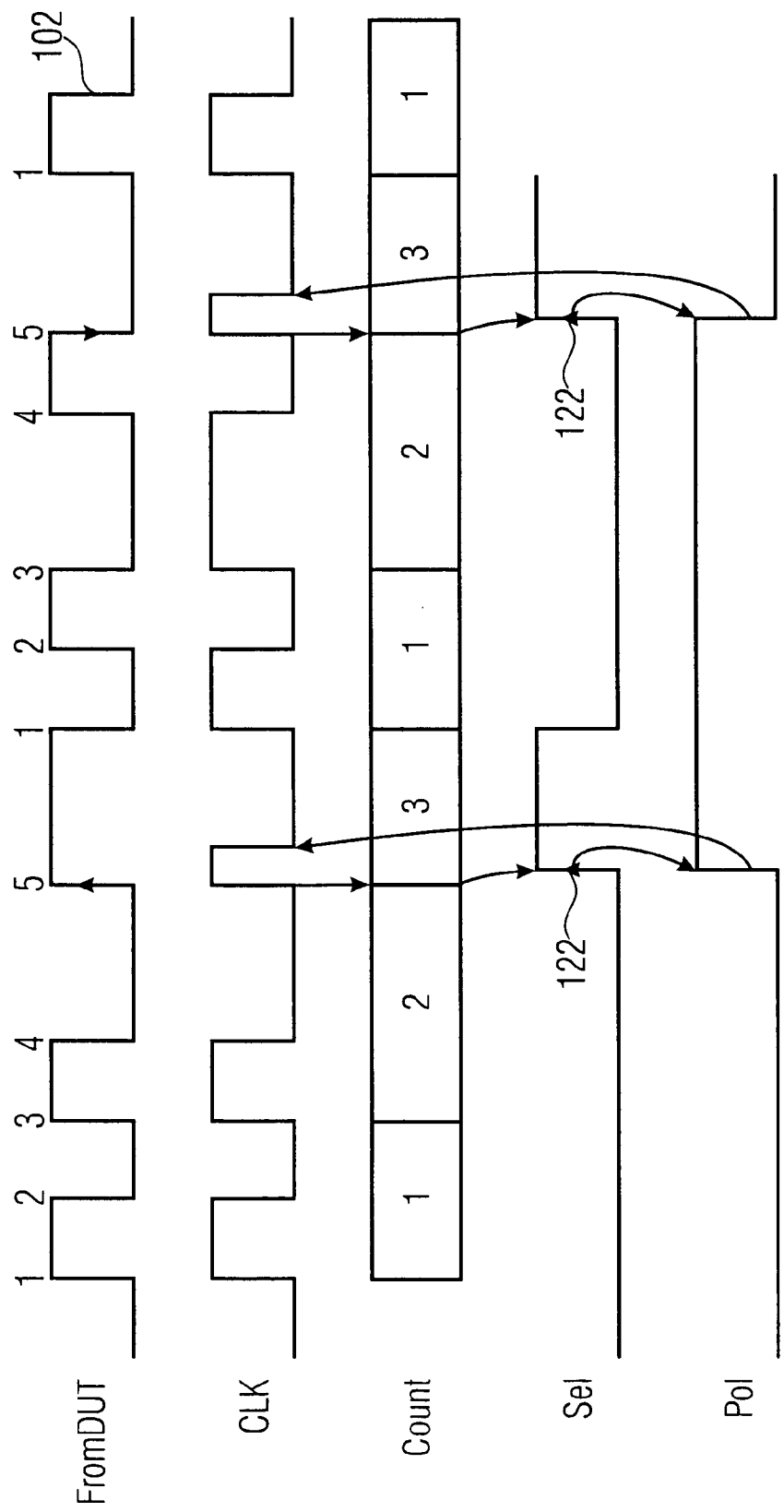

FIG. 6b shows a timing diagram of the signals appearing within the edge selector 600 shown in FIG. 6a, wherein the preset number of edges S is equal to 5. The first signal shows a bit stream 102, for example, received from a DUT. The second signal CLK shows the output of the XOR gate 620 representing alternating the inverted bit stream and the non-inverted bit stream. The third line indicates a counting index Count used by the divider 510. Since only rising edges are considered (alternatively, only falling edges may be considered) by the divider 510 in this example, every third count triggers the selection of an edge. This is illustrated by the fourth signal Se1 indicating two selected edges 122. Finally, the fifth signal Pu1 indicates the toggle signal changing its value every time an edge is selected by the divider 510.

Figure 7:
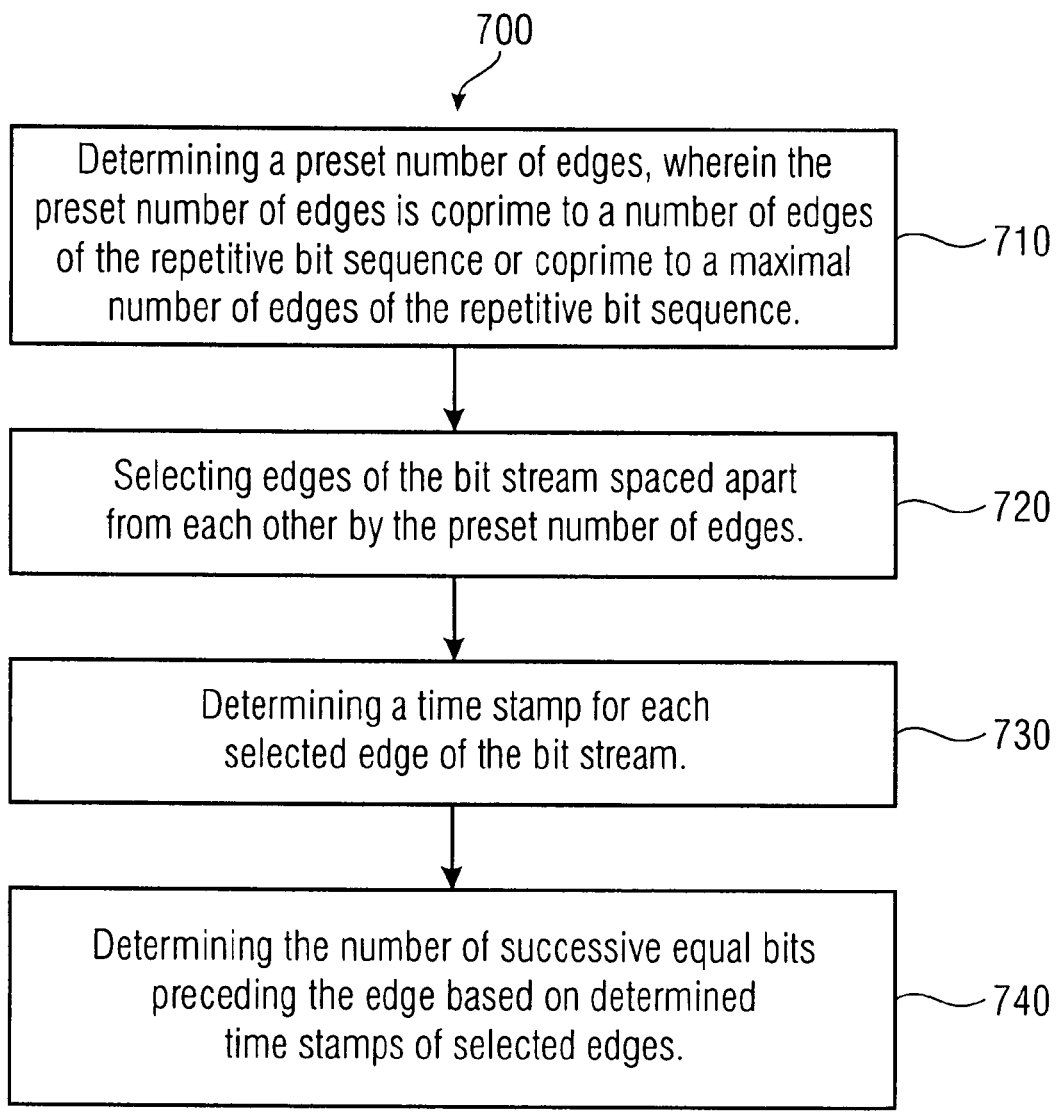
FIG. 7 is a flow chart of the method for determining a number of successive equal bits.

FIG. 7 shows a flow chart of a method 700 for determining a number of successive equal bits preceding an edge within a bit stream comprising a repetitive bit sequence according to an embodiment of the invention. The method 700 comprises determining 710 a preset number of edges, selecting 720 edges of the bit stream, determining 730 a time stamp for each selected edge of the bit stream and determining 740 the number of successive equal bits preceding the edge. The preset number of edges is determined 710, so that it is coprime to a number of edges of the repetitive bit sequence or coprime to a maximal number of edges of the repetitive bit sequence. The edges of the bit stream are selected 720 spaced from each other by the preset number of edges. Further, the number of successive equal bits preceding the edge are determined 740 based on determined time stamps of selected edges.

Figure 8:
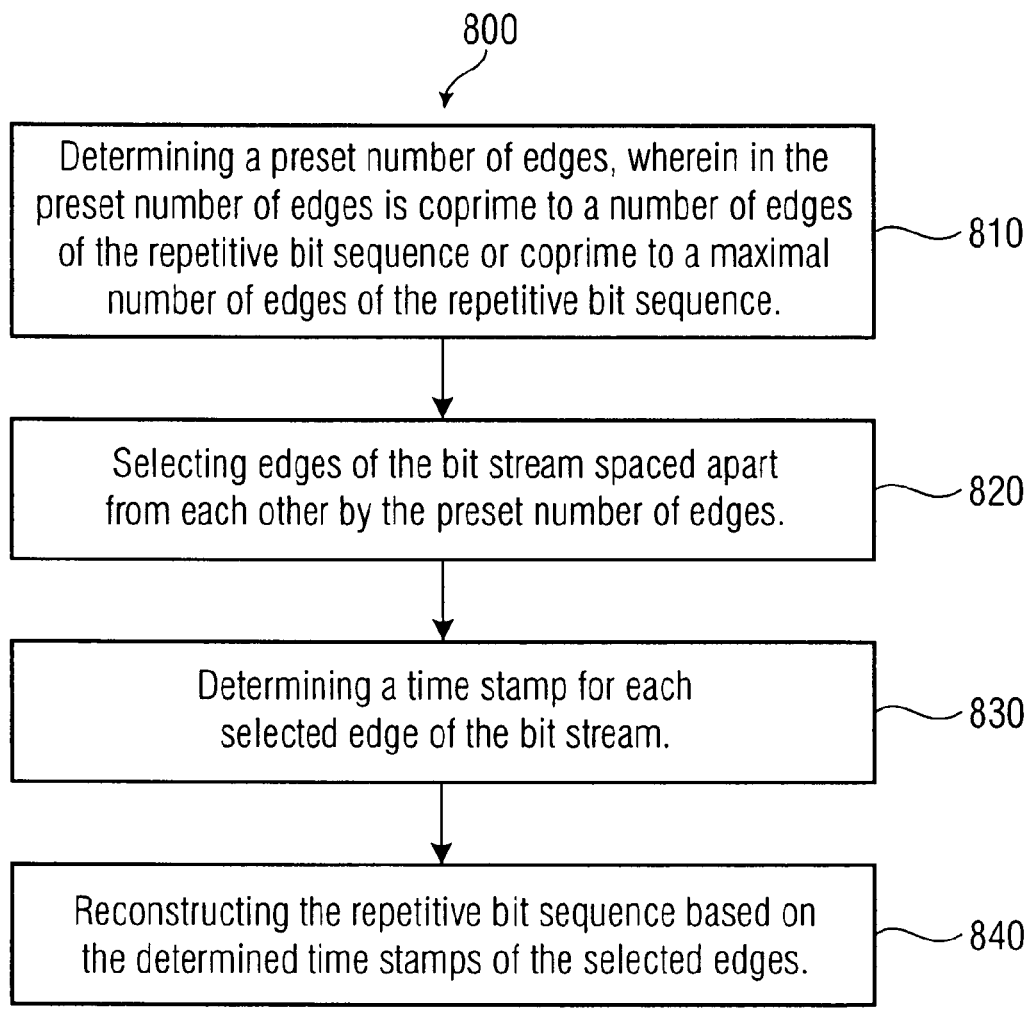
FIG. 8 is a flow chart of a method for reconstructing a repetitive bit sequence.

FIG. 8 shows a flow chart of a method 800 for reconstructing a repetitive bit sequence contained by a bit stream according to an embodiment of the invention. The method 800 comprises determining 810 a preset number of edges, selecting 820 edges of the bit stream, determining 830 a time stamp for each selected edge of the bit stream and reconstructing 840 the repetitive bit sequence. The preset number of edges is determined 810, so that it is coprime to a number of edges of the repetitive bit sequence or coprime to a maximal number of edges of the repetitive bit sequence. The edges of the bit stream are selected 820 spaced apart from each other by the preset number of edges. Further, the repetitive bit sequence is reconstructed 840 based on the determined time stamps of the selected edges.

Some embodiments according to the invention relate to a method for selecting edges of a bit stream. The method comprises selecting edges of the bit stream spaced apart from each other by a preset number of edges. The preset number of edges is an odd number. Further, the method comprises providing alternating an inverted bit stream or a non-inverted bit stream for selecting edges, wherein it is changed between the inverted bit stream and the non-inverted bit stream each time an edge is selected.

Some embodiments according to the invention relate to a counted under-sampling of transition times for jitter analysis. This method deals with time-stamps that are non-uniformly spaced in time and dedicated hardware to select time-stamped edges may be used. The described method proposes under-sampling in the context of time-stamping.

For separation of DDJ (data-dependent jitter), the run-length (number of equal bits) before each transition (edge) may be known. The goal is to obtain the run-length information of unknown bit-streams from transition time-stamping.

The bit stream is assumed to be repetitive and has known length, where the length is either known as number of bits, B>2, or number of transitions, E (E stands for edges).

Because time-stampers have a finite sample-rate, not every edge of a Gbps bit stream can be time-stamped.

One aspect of the proposed concept is time stamping every S-th edge, S coprime with E, to determine run-length (a number of successive equal bits preceding an edge). Additionally, also the direction (of an edge) may be captured and the complete bit stream may be reconstructed. This run length may be used for jitter analysis.

According to another aspect of the described concept, an apparatus may select and propagate every S-th edge (of a bit stream), where S is odd.

Some embodiments according to the invention relate to an application of an apparatus for determining a number of successive equal bits preceding an edge within a bit stream or an apparatus for reconstructing a repetitive bit sequence within a test system, e.g. an automatic test equipment (ATE). In this case, the bit stream with the repetitive bit sequence may be an output of a device under test (DUT).

In general a bit sequence or a bit stream is a digital sequence of a plurality of logic 0s and logical 1s. A bit stream comprising a repetitive bit sequence means, for example, a repetitive, gapless lining up of the same bit sequence forming the bit stream. An edge, also called transition, in the bit stream is a change from a logical 0 to a logical 1 or from a logical 1 to a logical 0. A direction of an edge of a transition indicates whether the transition is from a logical 0 to a logical 1 or from a logical 1 to a logical 0. Further, the bit period, also called unit interval, is the length of time a bit of the bit stream lasts and a bit period variation, also called jitter, is a variation of the length of time of a bit period, for example.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

Further, while the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:

1. An apparatus for determining a number of successive equal bits preceding an edge within a bit stream comprising a repetitive bit sequence, the apparatus comprising:
an edge number determiner configured to determine a preset number of edges, wherein the preset number of edges is coprime to a number of edges of the repetitive bit sequence or coprime to a maximal number of edges of the repetitive bit sequence;
an edge selector configured to select edges of the bit stream spaced apart from each other by the preset number of edges;
a time stamper configured to determine a time stamp for each selected edge of the bit stream; and
an equal bits determiner configured to determine the number of successive equal bits preceding an edge based on determined time stamps of selected edges.

2. The apparatus for determining a number of successive equal bits preceding an edge according to claim 1, wherein the equal bits determiner is configured to determine the number of successive equal bits based on relative bit numbers or absolute bit numbers determined based on determined time stamps of selected edges.

3. The apparatus according to claim 1, wherein the maximum number of edges of the repetitive bit sequence is equal to a number of bits of the bit sequence minus 1.

4. The apparatus according to claim 1, further comprising a bit number determiner configured to determine an absolute bit number within the bit stream associated to a selected edge based on the time stamp determined for the selected edge, wherein the absolute bit number indicates a position of the reference bit within the bit stream.

5. The apparatus according to claim 4, wherein the bit number determiner is configured to determine a relative bit number of the selected edge within the repetitive bit sequence based on the absolute bit number of the selected edge and based on a number of bits of the repetitive bit sequence.

6. The apparatus according to claim 1, further comprising a bit number determiner configured to determine an absolute bit number of a reference bit within the bit stream based on at least one determined time stamp of a selected edge, wherein the absolute bit number indicates a position of the reference bit within the bit stream.

7. The apparatus according to claim 6, wherein the bit number determiner is configured to determine the absolute bit number of the reference bit based on time stamps of two directly successive selected edges.

8. The apparatus according to claim 6, wherein the bit number determiner is configured to determine the absolute bit number based on time stamps of two directly successive selected edges, a maximum bit period, a minimum bit period and a maximum bit period variation, wherein the bit period indicates a temporal length of a bit of the bit stream.

9. The apparatus according to claim 6, wherein the bit number determiner is configured to determine an absolute bit number of a reference bit for each selected edge.

10. The apparatus according to claim 6, wherein a reference bit of a selected edge is the directly preceding bit or the directly succeeding bit of the selected edge.

11. The apparatus according to claim 6, wherein the bit number determiner is configured to determine a relative bit number within a repetitive bit sequence for a reference bit based on the absolute bit number of the reference bit and based on a number of bits of the repetitive bit sequence.

12. The apparatus according to claim 11, wherein the bit number determiner is configured to determine a relative bit number within the repetitive bit sequence for each reference bit, an absolute bit number is determined for.

13. The apparatus according to claim 11, wherein the bit number determiner is configured to sort the relative bit numbers of the reference bit in ascending order or descending order.

14. The apparatus according to claim 11, wherein the equal bits determiner is configured to determine the number of successive equal bits preceding the edge based on a relative bit number of a reference bit associated to the edge and a relative bit number of a reference bit associated to a directly preceding edge within the bit stream.

15. The apparatus according to claim 1, wherein the edge selector is configured to select edges from the bit stream until at least a number of edges equal to the number of edges of the repetitive bit sequence or equal to the maximal number of edges of the repetitive bit sequence is selected.

16. The apparatus according to claim 1, wherein the number of edges of the repetitive bit sequence or a number of bits of the repetitive bit sequence is predefined.

17. The apparatus according to claim 1, further comprising a bit sequence length determiner, wherein the edge selector is configured to select edges from the bit stream until at least a number of edges equal to the number of edges of the repetitive bit sequence plus 1 is selected and the bit sequence length determiner is configured to determine a number of bits of the repetitive bit sequence based on time stamps of two edges spaced apart from each other by a number of selected edges equal to the number of edges of the repetitive bit sequence plus 1.

18. The apparatus according to claim 1, wherein the edge number determiner is configured to determine the preset number of edges, so that the preset number of edges is the smallest number coprime to a number of edges of the repetitive bit sequence or coprime to a maximal number of edges of the repetitive bit sequence considering a maximum sample rate of the time stamp.

19. The apparatus according to claim 1, wherein the edge number determiner is configured to determine a plurality of preset numbers of edges, wherein each preset number of edges is coprime to the maximal number of edges of the repetitive bit sequence, and wherein each preset number of edges is coprime to each other preset number of edges, wherein a product of the preset numbers of edges of the plurality of preset numbers of edges is larger than the maximal number of edges of the repetitive bit sequence, wherein the edge selector is configured to select edges of the bit stream for each preset number of edges spaced apart from each other by the respective preset number of edges.

20. The apparatus according to claim 1, wherein the edge selector comprises:
a divider configured to select edges of a bit stream spaced apart from each other by the preset number of edges, wherein the preset number of edges is an odd number; and
an inverter configured to provide alternating an inverted bit stream or a non-inverted bit stream to the divider for selecting edges of the bit stream, wherein the inverter changes between the inverted bit stream and the non-inverted bit stream each time an edge is selected by the divider.

21. The apparatus according to claim 20, wherein the edge selector comprises a toggle unit configured to provide a toggle signal to the inverter, wherein the toggle unit is configured to change a value of the toggle signal each time an edge is selected by the divider.

22. The apparatus according to claim 21, wherein the inverter comprises an XOR gate, wherein the bit stream is provided to a first input of the XOR gate, the toggle signal is provided to a second input of the XOR gate and the inverted bit stream or the non-inverted bit stream is provided at an output of the XOR gate.

23. An automatic test equipment with an apparatus for determining a number of successive equal bits preceding an edge within a bit stream comprising a repetitive bit sequence, said apparatus comprising:
an edge number determiner configured to determine a preset number of edges, wherein the preset number of edges is coprime to a number of edges of the repetitive bit sequence or coprime to a maximal number of edges of the repetitive bit sequence;
an edge selector configured to select edges of the bit stream spaced apart from each other by the preset number of edges;
a time stamper configured to determine a time stamp for each selected edge of the bit stream; and
an equal bits determiner configured to determine the number of successive equal bits preceding an edge based on determined time stamps of selected edges.

24. A computer-readable storage medium having stored thereon, computer-executable instructions for performing a method for determining a number of successive equal bits preceding an edge within a bit stream comprising a repetitive bit sequence, that when executed by a computing device cause the computing device to perform a method comprising:
determining a preset number of edges, wherein the preset number of edges is coprime to a number of edges of the repetitive bit sequence or coprime to a maximal number of edges of the repetitive bit sequence;
selecting edges of the bit stream spaced apart from each other by the preset number of edges;
determining a time stamp for each selected edge of the bit stream; and
determining the number of successive equal bits preceding the edge based on determined time stamps of selected edges.

* * * * *